United States Patent [19]

Dumke et al.

[11] 3,780,359

[45] Dec. 18, 1973

[54] BIPOLAR TRANSISTOR WITH A HETEROJUNCTION EMITTER AND A METHOD FABRICATING THE SAME

[75] Inventors: William P. Dumke, Chappaqua; Vincent L. Rideout, Mohegan Lake; Jerry M. Woodall, White Plains, all of N.Y.

[73] Assignee: International Business Machines Corporation, Armonk, N.Y.

[22] Filed: Dec. 20, 1971

[21] Appl. No.: 209,620

[52] U.S. Cl. .. 317/235 R, 317/235 N, 317/235 AC, 317/235 AM, 317/235 WW, 148/175

[51] Int. Cl. ............................ H01l 3/20, H01l 9/12

[58] Field of Search ............. 317/235 AC, 235 AM, 317/235 N, 235 WW

[56] References Cited

UNITED STATES PATENTS

| | | | |
|---|---|---|---|
| 3,473,977 | 10/1969 | Skouson | 148/175 |
| 3,380,153 | 4/1968 | Husher | 29/577 |
| 3,413,533 | 11/1968 | Kroemer | 317/235 |
| 3,604,991 | 9/1971 | Yonezer | 317/235 R |
| 3,436,625 | 4/1969 | Newman | 317/237 |

OTHER PUBLICATIONS

Hovel, I.B.M. Tech. Discl. Bull., Vol. 12, No. 9 February 1970 page 1381.

Statz, I.B.M. Tech. Discl. Bull., Vol. 9, No. 7, Dec. 1966, p. 914.

Kressel et al., Applied Physics Letters, Vol. 15, No. 1, 1 July 1969 pages 7–9.

Shih et al., I.B.M. Tech. Discl. Bull., Vol. 11, No. 12, May 1969, p. 1634.

*Primary Examiner*—Martin H. Edlow
*Attorney*—Hansel L. McGee et al.

[57] ABSTRACT

An improved heterojunction transistor and a method of fabricating the same is provided. The device is comprised of liquid phase epitaxially grown binary compound layers of group IIIA-VB semiconductor materials which serve as collector and base regions and of a ternary compound layer of group IIIA-VB semiconductor material which serves as the heterojunction emitter.

8 Claims, 5 Drawing Figures

INVENTORS

WILLIAM P. DUMKE

VINCENT L. RIDEOUT

JERRY M. WOODALL

BY Hansel L. McGee

ATTORNEY

BIPOLAR TRANSISTOR WITH A HETEROJUNCTION EMITTER AND A METHOD FABRICATING THE SAME

BACKGROUND OF THE INVENTION

1. Field of the Invention

The invention relates to improved heterojunction transistors; more specifically the invention relates to GaAs-GaAlAs heterojunction transistors for high frequency operation and to a method of fabricating the same.

2. Prior Art

For more than a decade there has been considerable interest in the development of heterojunction devices. These devices have the potential of providing higher current gains that do conventional homojunction transistors, e.g., those prepared from Si or Ge. H. Kroemer in his publication entitled, *Theory of a Wide-Gap Emitter For Transistors*, Proc. IRE, Vol. 45, pp. 1535–1542, Nov. 1957, provides a mathematical analysis for such a device, but does not provide an actual working model. Kroemer indicates that in order to obtain a high DC current gain, it is important in transistors that the ratio of the injected minority carrier current to the total emitter current be close to unity or, in other words, that the injection deficit be as small as possible. He postulates that this can be obtained if the emitter region has a higher band gap than the base region.

Following Kroemer's postulates, several experimenters have fabricated heterojunction devices with varying degrees of success. For example, heterojunction devices prepared from amorphous CdS on Si having gains of 10 have been provided by S. Brojdo et al, *The Heterojunction Transistor And Space Charge Limited Triode*, British Journal Applied Physics, Vol. 16, p. 133, 1965. R. Zuleig, *Development of a Thin Film Space Charge Limited Triode, Hughes Research Labs, Contract NAS* 12–5, June 1966, has prepared a heterojunction device from polycrystalline GaAs on Si having a gain of 5. A device of single crystal GaAs and Ge having a gain of 13 was prepared by D. K. Jadus et al, *The Realization of a GaAs-Ge Wide Band Gap Emitter Transistor*, IEEE Transactions on Electron Devices, Vol. ED–16, pp. 102–107, Jan. 1969. H. J. Hovel and A. Milnes prepared similar devices from single-crystal ZnSe and Ge ZnSe-Ge Heterojunction Transistors, IEEE Transactions on Electron Devices, Vol. ED–16, No. 9, Sept. 1969.

While heterojunction devices have been provided, as evidenced above, these devices have many inherent disadvantages. For example: Some prior art heterojunction devices have distorted junction doping profiles due to cross-doping. In the case of GaAs-Ge heterojunctions, for example, there is diffusion of some of the elements across the junction, i.e., Ga and As diffuse into the Ge region. This gives rise to distorted junction doping profiles and contributes to the low efficiency exhibited by these devices. These devices also had distorted electrical properties due to interface contamination that occurs during fabrication.

In order to obtain good high frequency response, it is desirable to have a base region with low resistivity and a high minority carrier mobility, but previous heterojunction transistor devices had base regions with relatively low minority carrier mobilities e.g., less than 1000 $cm^2$/volt-sec. and relatively high resistivities, i.e., greater than 0.05 ohm-cm.

SUMMARY OF THE INVENTION

High frequency heterojunction transistors having common emitter DC current gains of 25 or more are prepared. The transistor device is comprised of an n type IIIA-VB compound collector (e.g., GaAs with donor concentrations of about $10^{16}$ $cm^{-3}$ to $10^{17}$ $cm^{-3}$), a p type IIIA-VB, base region (e.g., GaAs with an acceptor concentration of about $10^{18}$ $cm^{-3}$), and an emitter region composed of an IIIA-VB compound alloy (e.g., $Ga_{1-x}Al_xAs$, where x is from about 0.3 to about 0.9.) Other IIIA-VB compound alloys which are selectively etchable with respect to the material in the base region can also be used. The emitter region has a carrier concentration of about $10^{17}$ $cm^{-3}$ to about $10^{18}$ $cm^{-3}$. Additionally, the above structure can be supported by an n+ GaAs substrate which serves as a subcollector. Conventional ohmic contacts are applied to the emitter, base and to the collector or sub-collector.

The devices can be fabricated according to the liquid phase epitaxy growth technique disclosed by J. M. Woodall in a publication entitled, *Isothermal Solution Mixing Growth of Thin $Ga_{1-x}Al_xAs$ Layers*, Journal Electrochemical Society, Solid State Science, Vol. 118, No. 1, pp. 150–152, Jan. 1971. One critical discovery in the fabrication of the present devices is that $Ga_{1-x}Al_xAs$ can be selectively etched with hot HCl or hot aqueous $H_3PO_4$, without appreciably etching GaAs.

OBJECTS OF THE INVENTION

It is therefore an object of the invention to provide improved heterojunction transistor devices.

It is another object of the invention to provide improved heterojunction transistor devices fabricated from $Ga_{1-x}Al_xAs$ and GaAs.

It is yet another object of the invention to provide improved heterojunction transistor devices having a highly doped and low resistance base region with high common emitter DC current gain.

It is still another object of the invention to provide an improved method of fabricating heterojunction transistor devices.

The foregoing and other objects, features and advantages of the invention will be apparent from the following more particular description of preferred embodiments of the invention, as illustrated in the accompanying drawings.

DESCRIPTION OF THE PREFERRED EMBODIMENTS

Figure 1:
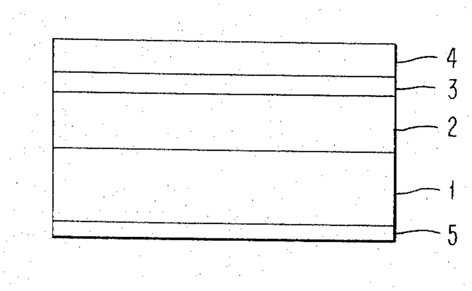
FIGS. 1, 2 and 3 are enlarged elevation views of a heterojunction structure illustrating intermediate stages in a method for fabrication heterojunction transistor devices of the invention.

In an illustrative embodiment, the device of this invention is made by depositing a series of liquid phase epitaxial layers on a substrate which can function as a subcollector. The depositions are made in rapid sequence, the method of which is disclosed in copending application Ser. No. 64,523 to Johannes Grandia, Robert M. Potemski and Jerry M. Woodall, filed Aug. 17, 1970. The method and apparatus disclosed in the above-mentioned application are herein incorporated by reference.

The semicondcutor compositions used in this invention are of high purity and are commercially available. The material for the base, collector and sub-collector portions of the device are chosen from group IIIA-VB binary compounds and are the same except that they have different levels and types of dopants. The doping level of the base region is from about $10^{18}$ $cm^{-3}$ to about $10^{19}$ $cm^{-3}$, for the collector from about $10^{16}$ $cm^{-3}$ to about $10^{17}$ $cm^{-3}$ and the sub-collector is degenerately doped, i.e., greater than $10^{18}$ $cm^{-3}$. The base thickness is maintained at about 0.1 to about 1 micron. This thin base layer provides a small electron minority carrier transit time which effects the high gain and frequency characteristic of the device. The thicknesses of the collector can be in the range of 1–50 microns, with the emitter being from about 1 to about 10 microns thick. The material for the emitter region is selected from group IIIA–VB ternary alloys. These materials are chosen such that their band gap is larger than that of the base material. This condition alloys for the energy barrier restricting the injection of holes from the base into the emitter to be greater than that restricting the injection of minority carriers into the base, a condition that has been indicated to result in a favorable injection efficiency and to contribute to a high common emitter DC current gain. The emitter material should have a close lattice and thermal expansion coefficient match with the base material, in order to minimize misfit dislocations and strain at the emitter-base interface. Misfit disclocations and strain can cause recombination states and/or traps at the interface thereby causing serious degradation of the injection characteristics of the emitter. As a result of such imperfections there would be a lowered injection efficiency.

Another requirement for the emitter is that its composition should be such that cross-doping cannot occur across the heterojunction formed with the base to thereby give a distorted doping profile. In this invention the group IIIA metals used for the base and emitter regions are iso-electronic and hence cross-doping will not occur.

Figure 2:
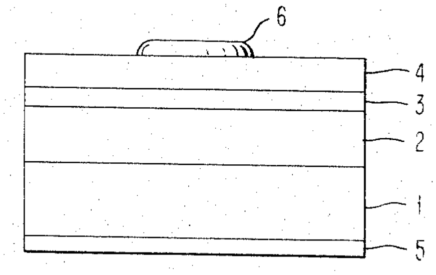
Figure 3:
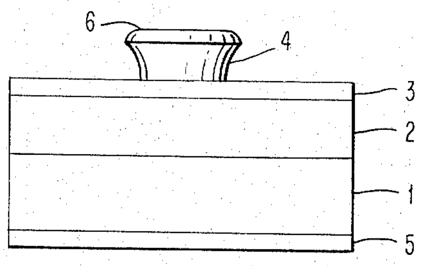
Figure 4:
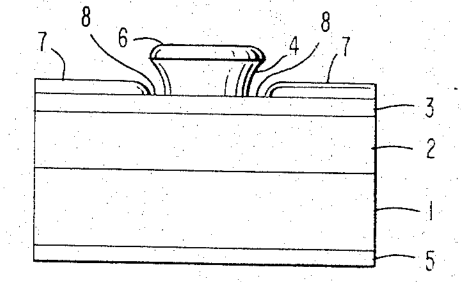
FIG. 4 is an enlarged elevation view of the completed heterojunction transistor device of the invention.

In general, the heterojunction transistor device of this invention can be fabricated according to the following sequence of steps (with reference to FIG. 1):

a. a substrate 1 comprised of a n type doped IIIA-VB binary compounds and having an ohmic contact 5 attached thereto is provided, said substrate functions as a sub-collector;

b. a first layer 2 of an n type IIIA-VB binary compound is deposited on the substrate 1, said first layer 2 functions as a collector;

c. a heavily doped thin second layer 3 of a p type IIIA-VB binary compound is deposited onto said first layer 2, said second layer functions as a base region;

d. a third layer 4 of a n type VB compound ternary compound, having a good lattice match with the second layer 3, is deposited onto said second layer 3, said third layer functions as an emitter region;

e. a material 6 which is acid resistant and which makes good ohmic contact with said third layer 4 is deposited and alloyed on said third layer 4 in a predetermined pattern (see FIG. 2).

f. the exposed areas of said third layer 4 are subjected to an etchant, said etchant being relatively active with respect to the composition of third layer 4 but relatively inert with respect to the composition of second layer 3 (see FIG. 3); and g. ohmic contacts are evaporated onto the exposed areas of said second layer 3 (see FIG. 4).

The fabrication of the device is best obtained by growing the above-described regions by liquid phase epitaxy (LPE). A detailed technique for growing multilayers by liquid phase epitaxy is described in the above-mentioned publication to J. M. Woodall entitled, *Isothermal Solution Mixing Growth of Thin $Ga_{1-x}Al_xAs$ Layers*, Journal Electrochemical Society, Solid State Science, p. 150 (January 1971). The technique disclosed therein is incorporated herein by reference. This technique makes it possible to make a thin, highly doped p-type base region. As has been appreciated, the relatively high electron mobility in group IIIA-VB compounds, for example, GaAs, contributes to a very low minority carrier base transit time in n-p-n transistors. Growth of the base regions by LPE allows this region to be more heavily doped and, therefore, to have a lower base sheet resistance, e.g., on the order of 1000 ohms/sq. inch, than is possible by diffusion or by gas phase epitaxy techniques. Additionally, growth of the base by LPE also allows for the use of slowly diffusing dopants and therefore, provides sharply defined impurity profiles necessary for thin base regions.

In a preferred embodiment of the invention, a device is fabricated comprising an n type GaAs substrate, which functions as a sub-collector, an n type GaAs layer functioning as a collector, a p type GaAs layer functioning as the base and an n type $Ga_{1-x}Al_xAs$ layer with $x$ about 0.3 to about 0.9, which functions as the emitter.

In the course of the development of this device, it was discovered that the $Ga_{1-x}Al_xAs$ layer could be etched without any appreciable etching of the GaAs underlayer. This discovery has led to the simplification of the fabrication and the improved performance of the present device. It now provides a needed technique for removing part of the emitter material in order to make contact to the base region. This is an advantage over the vapor-grown GaAs and $GaAs_{1-x}P_x$ transistors disclosed by J. P. Dismukes et al in the publication entitled, *Development of GaAs and $GaAs_{1-x}P_x$* Thin-Film Bipolar Transistors, NASA Report NAS 12–2091, Dec. 1969.

The etching properties of $Ga_{1-x}Al_xAs$ are also utilized to obtain a considerable reduction in the collector junction area. This reduction results because it is now possible to automatically register the position of the base contact relative to that of the emitter and thereby reduce the area resulting from the emitter junction base-contact separation. This provides for a smaller collector junction area and capacitance, which thereby enhances the high frequency capabilities of the device. If the etchant removing the unwanted portion of the $Ga_{1-x}Al_xAs$ is allowed to undercut the emitter contact, the undercutting will provide a small but even separation between the edges of the emitter junction and a vacuum evaporated base contact. This method of preparation provides a self-registered base contact.

The etchants of choice for the preferred embodiment are hot these acids or hot $H_3PO_4$. It has been found that HCl will dissolve $Ga_{1-x}Al_xAs$ if $x > 0.3$. The rate of dissolution increases with increasing $x$, temperature, and concentration of the HCl or $H_3PO_4$. In the time required to dissolve a 10$\mu$ thick $Ga_{0.5}As$ layer, the dissolution of pure GaAs was much less than 0.1$\mu$. Thus, the emitter material can be removed without substantially disturbing the GaAs base and without having to monitor the etching process. Additionally, it has been found that Au-Ge eutectic alloy forms a good ohmic contact to n type $Ga_{1-x}Al_xAs$ and is very resistant to attack K by HCl or $H_3PO_4$. It is, therefore, a good maskant for protecting selection emitter areas during etching. Alternately, some commercial photoresist can be used as a mask and the contacts can be subsequently deposited.

The base and sub-collector ohmic contacts can be fashioned from conventional materials that form good ohmic contact with GaAs, for example, Au-Ge, Au-Zn, Au-Sn, and Sn can be used. These contacts can be made by conventional evaporation and alloying techniques or by other conventional methods.

Dopants used in this invention are Sn for the collector and emitter, and Ge for the base region. Because Sn and Ge are non-volatile, cross-contamination between the different melts is minimized and therefore, better doping control is achieved. However, Te can be substituted for Sn as an n type dopant. Additionally, Ge has a much smaller diffusion coefficient than volatile group IIB dopants such as Zn and Cd. In preferred embodiments it is desirable to have a collector electron concentration of about $4 \times 10^{16}$ cm$^{-3}$ to about $1 \times 10^{18}$ cm$^{-3}$, a base hole concentration of about $1 \times 10^{18}$ cm$^{-3}$ to about $1 \times 10^{19}$ cm$^{-3}$, and an emitter electron concentration of about $10^{17}$ cm$^{-3}$ to about $10^{18}$ cm$^{-3}$.

The product of the above method has the structure shown in FIG. 1, having a substrate 1 (sub-collector), a collector region 2, a base region 3 and an emitter region 4. The collector contact 5 is conventionally evaporated and alloyed on the structure as shown in the FIG. The contact 5 can be a metal which makes good ohmic contact with GaAs, such as Au-Ge, Au-Sn or Sn. Alternately, the contact 5 can be evaporated onto the substrate prior to the multilayering operation above.

The structure of FIG. 1 is then placed in a conventional evaporation apparatus. It is masked and a Au-Ge alloy contact 6 is deposited onto the emitter region 4, as shown in FIG. 2. After the formation of the Au-Ge ohmic contact 6, it is immersed in concentrated HCl at about 50°C to about 80°C for a time sufficient for the mesa-like structure with undercutting to develop, e.g., one minute. The structure is again placed in an evaporation apparatus, metal contacts 7 (e.g., Au-Zn) are evaporated onto the base region and alloyed thereto. The contacts are formed in those areas that are not overshadowed by the undercut portion 8 of the mesa-like structure.

Figure 5:
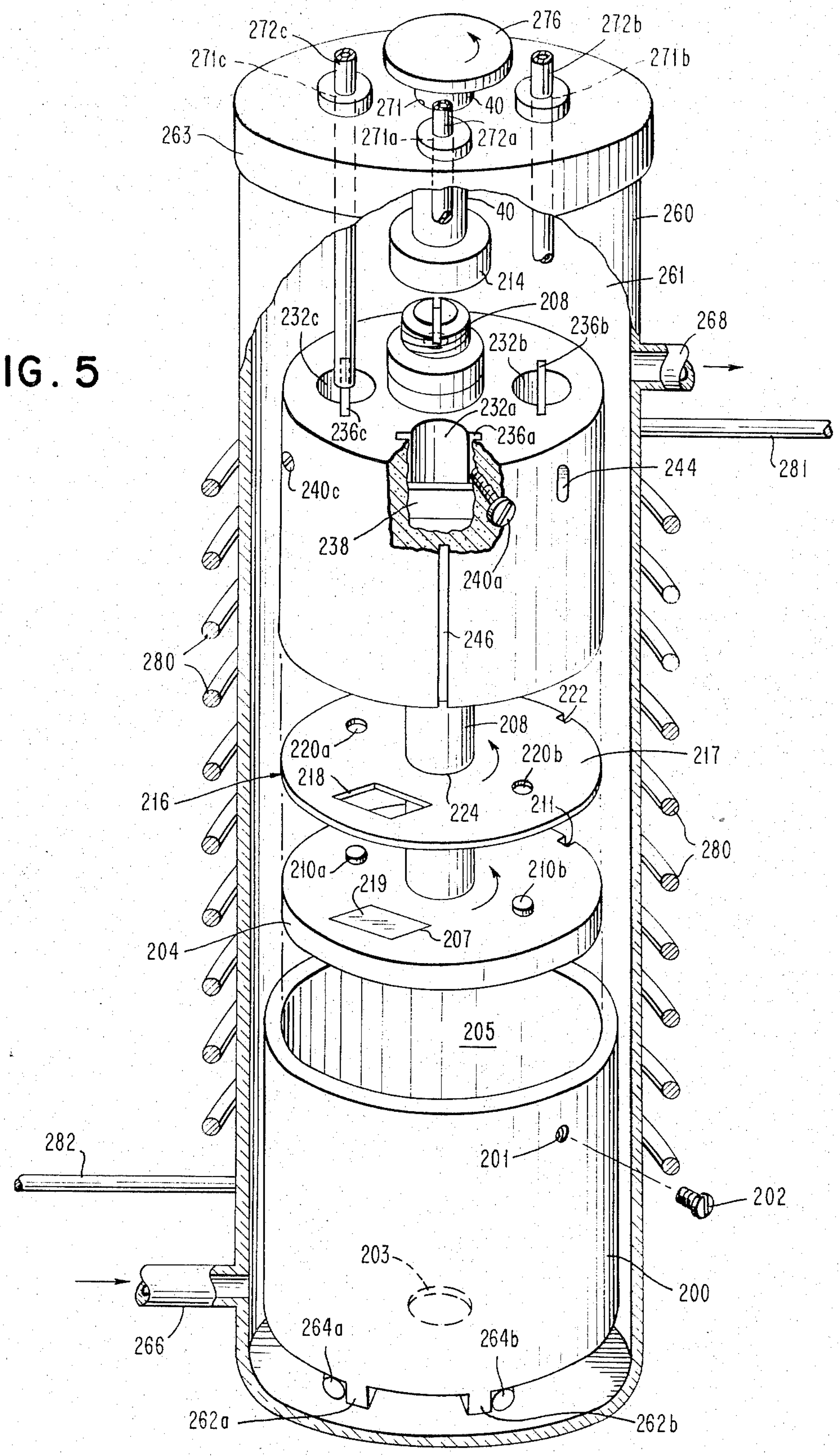
FIG. 5 is a vertical section of an apparatus for growing multilayered structures by liquid phase epitaxy.

Illustrative devices are prepared in the apparatus shown in FIG. 5 in the aforementioned patent application, Ser. No. 64,523 and shown in FIG. 5 herein. Referring now to FIG. 5, there is shown an apparatus for growing multilayered structures. The apparatus is shown in vertical section.

The apparatus illustrated in FIG. 5 comprises an outer crucible 200 with inner volume 205, feet **262*a* and 262*b*, a tapped hole 201 and retaining screw 202. The outer crucible 200 fits into the bottom of the quartz chamber 260 and does not rotate with respect thereto. It also houses the other components of the crucible. The substrate wafer holder 204 consists of a flat disk structure with a depression 207 to house the wafer, two tapped holes with retaining screws 210*a* and 210*b*, a bottom projection, not shown, which rides in cylindrical depression 203 in the bottom of outer crucible 200, a venting slot 211, and a vertical shaft 208 ending in threaded portion 212. The substrate wafer retainer and spacer 216 has a window 218, center hole 224 which fits over shaft 208, a through window 218 slightly smaller than the wafer, two through holes 220 which are 180° apart and are 90° from the through window, and a vent slot 22. Barrel 230 with center hole 242 fits over shaft 208. It has three melt chambers, 232*a*, 232*b* and 232*c* with key slots 236 which extend approximately two-thirds of the way down the barrel. Retaining screw 240 stops a source material bar 238 from rising in the melt after it has been inserted in the slot 236. A vent slot 246 extends the length of the barrel 230 and a vent hole is positioned at one of the four 90° positions on the same radius as the melt chambers 232*a*, 232*b* and 232*c*. A stop slot 244 which receives stop crew 202 and maintains the position of the barrel so that it does not rotate with respect to part 200. A nut 214 is fastened to the top of shaft 208 and holds the crucible turning quartz rod 40 to shaft 208**.

The growth chamber within which the growth apparatus is established will now be described. A quartz cylinder 260 with a flat bottom, has with two stop rods **264*a* and 264*b* at the bottom to hold the outer crucible with respect to itself. An inlet tube 266 and exit tube 268 are attached to the quartz cylinder. This is then fitted with a vacuum seal fitting 263. The quartz rods 264*a* and 264*b* are parallel to the bottom of the quartz tube 260 and are spaced so projections 262*a* and 262*b* from the outer retainer crucible 200 fit between the rods and do not allow rotation of the outer crucible. The vacuum seal fitting 263 has four smaller vacuum connectors on the top thereof: one seal 271 at the center and the other three seals 271*a*, 271*b* and 271*c* are placed 90° apart from each other on the same radius as the melt chambers in barrel 230. The vacuum seal fitting is oriented so that the dopant drop tubes 272*a*, 272*b* and 272*c* via seals 271*a*, 271*b* and 271*c* respectively are above the desired respective chambers 232*a*, 232*b* and 232*c***.

In operation, the prepared substrate wafer is placed in the wafer chamber 207 on the surface of wafer support 204. The wafer retainer and spacer 216 is positioned over the shaft 208 so that the window 218 is over the wafer and retains it and forms the melt storage volume. The two stop screws 210 are brought flush to the surface of the wafer retainer and spacer 216. Care must be taken that the stop screws 210 do not extend above the plane of the surface 217 of spacer 216 where they would interfere with the rotation thereof relative to the barrel 230. The barrel 230 with its center hole 242 slides over shaft 208 and is positioned such that the vent hole 234 is above the wafer 219 and the wafer window 207.

The source materials **238*a*, 238*b* and 238*c* are put in the appropriate slots 236*a*, 236*b* and 236*c* and are retained below the surface of the melt by retaining screw 240*a*, 240*b* and 240*c*, respectively. The subassembly parts 204, shaft 208, substrate support 216 and the barrel 230 are then placed in the cylindrical opening 205 of outer crucible 200 and retained there by the retaining screw 202 in the threaded hole 201 via slot 244 in barrel 230. As assembled, the barrel 230 and the outer crucible 200 are fixed with respect to each other. The shaft 208, wafer holder 206 and the retaining spacer 216 are immobile with respect to each other but free to turn with respect to the barrel 230 and the outer crucible 200. When the vent hole 234 is aligned with the wafer window 207 and wafer 219, there is then an entire vent slot consisting of partial vent slots 246, 222 and 211. The entire vent slot formed by partial vent slots 246, 222 and 211 allows the bottom cylindrical opening 203 under substrate support 204 to be vented. The wafer-holding support 204, shaft 208, spacer retainer 216 and barrel assembly 231 are placed into the hole 205 of the outer crucible 200. The screw 202 is then inserted into slot 244 of barrel 230 and prevents rotation of barrel 230 with respect to outer crucible 200**.

The quartz rod 40 is connected to the crucible assembly and is used to lower the assembled crucible into the chamber 261 of quartz container 260. The appropriate melts. e.g., GaAs and GaAlAs, are placed in the respective melt chambers 232*a*, 232*b* and 232*c* and the crucible assembly is ready to be inserted into the quartz container 260. When the crucible assembly is in the bottom of the chamber 261, two quartz rods 264*a* and 264*b* position it and keep it from turning with respect to the quartz ware. The fitting and seal 263 for the top of the quartz container 260 is then placed in position with the drop tubes 272*a*, 272*b* and 272*c* being loaded with the appropriate dopants, e.g., Sn and Ge, over the respective melt chamber 232*a*, 232*b* and 232*c*. The system inlet and outlet ports 265 and 267 are then fastened to the hydrogen input and the vacuum line, not shown. After the appropriate flush time has elapsed, the hydrogen line is turned off and the vacuum line opened so that the entire system including the hydrogen line is evacuated. During this period, the vent hole 234 is positioned over the wafer 219 and venting of the chamber 203 volume is accomplished. The slots 246, 222 and 211 were previously aligned so that the venting of the entire crucible assembly is now possible. When the vacuum pressure reaches approximately one micron of Hg, the entire unit is heated from 200°–250°C by furnace windings 280 electrically energized via input and output terminals 281 and 282 from a power source, not shown. Temperature of the apparatus is maintained for approximately 15 minutes and the vacuum line is then closed and the system is backfilled with hydrogen and a hydrogen flush is maintained throughout the entire run. The furnace 280 is then brought to temperature and the crucible assembly 259 and growth materials in chambers 232*a*, 232*b* and 232*c* are soaked for an appropriate length of time, usually about 60 to 90 minutes. After this period the first rotation is accomplished. The shaft 40 via knob 276 is rotated 90° so that the wafer holder 204 and the spacer retainer 216 are moved into the first melt position, e.g., GaAs. If desired at this time, dopants could be added to the first melt.

The furnace is now cooled at approximately 0.1°C per minute for an appropriate period of time, depending on the thickness of the desired layer. The heating and cooling cycle program is then shut off and the rotations of shaft 40 are initiated for isothermal solution growth according to the principles of this invention. Illustratively, there is a rotation of 90° into the second melt (GaAs) at chamber 232*b* where there is a hold for 30 seconds to three minutes depending upon the amount of growth selected, and then a rotation to the third melt (GaAlAs) at chamber 232*c*.This mode of rotation is continued until the selected number of layers is achieved. After the final rotation to chamber 232*c*, a cooling program is then continued for approximately 30 minutes at a rate of 0.1°C/min. After this cooling period, the wafer 219 is rotated to a neutral position, e.g., a 45° rotation, and the power turned off to terminal 281 and 282 of the furnace 280.

For another mode of growth, the cooling program is not shut off after the initial cooling period, but continued during rotation of the substrate holder 204 into the second melt. After an appropriate cooling time in the second melt, the wafer is rotated to a neutral position. For still another mode of solid growth, three melts in chambers 232*a*, 232*b* and 232*c* may be utilized after the growth is finished in the second melt. There is rotation of the substrate holder 204 into the third melt for a short period of time, finally then rotation into a neutral position and turning off the power to the furnace. The third melt is used to terminate growth so that a fast growth layer does not appear on the surface of the multilayer structure. After the termination of the run, the crucible assembly and quartz container 260 are normally left in the furnace windings 280 under hydrogen flush until both have cooled to room temperature.

While the invention has been particularly shown and described with reference to preferred embodiments thereof, it will be understood by those skilled in the art that various changes in form and details may be made therein without departing from the spirit and scope of the invention.

What is claimed is:

1. A bipolar semiconductor transistor with a heterojunction emitter having a high common emitter DC current gain comprising:

a. an n+type binary IIIA-VB compound degenerately doped substrate having an ohmic contact on its undersurface, said substrate functioning as a subcollector;

b. A first epitaxial *n* type binary IIIA-VB compound layer disposed on said substrate said first layer functioning as a collector region;

c. a second epitaxial p type layer of GaAs disposed on said first layer said second layer having a low resistivity and a high minority carrier mobility and functioning as a base region;

d. a third epitaxial n type layer of $Ga_{1-x}Al_xAs$ disposed on a portion of the upper surface of said second layer having a higher energy band gap with respect to said second layer and having a close lattice and thermal expansion coefficient match therewith, said third layer functioning as an emitter region and wherein $x \geq 0.3$; and e. ohmic contacts disposed on an upper surface portion of said second layer different from said first mentioned portion of the upper surface of said second layer and on said third layer.

2. A bipolar transistor with a heterojunction emitter according to claim 1, wherein said first and third epitaxial layers are doped with an element selected from the group consisting of Sn and Te, and said second epitaxial layer is doped with Ge.

3. A bipolar transistor with a heterojunction emitter according to claim 1 wherein said substrate is *n*+ type GaAs and said first epitaxial layer is *n* type GaAs.

4. A bipolar transistor with a heterojunction according to claim 3 with said first epitaxial layer having a donor concentration of from about $10^{16}$ cm$^{-3}$ to about $10^{17}$ cm$^{-3}$, said second epitaxial layer having an acceptor concentration of about $10^{18}$ cm$^{-3}$ and said third epitaxial layer having a carrier concentration of from about $10^{17}$ cm$^{-3}$ to about $10^{18}$ cm$^{-3}$.

5. A bipolar transistor with a heterojunction emitter according to claim 4 wherein said second epitaxial layer has a sheet resistance on the order of 1000 ohms/sq. inch and a minority carrier mobility greater than 1000 cm$^2$/volt sec.

6. A bipolar transistor with a heterojunction emitter according to claim 5 wherein said first epitaxial layer is from about 1$\mu$ to about 50$\mu$ thick, said second epitaxial layer is from about 0.1$\mu$ to about 1.0$\mu$ thick and said third epitaxial layer is from about 1$\mu$ to about 10$\mu$ thick.

7. A bipolar transistor with a heterojunction emitter according to claim 6 wherein said ohmic contact to said third layer is selected from the group consisting of an Au-Ge alloy, an Au-Sn alloy and Sn.

8. A bipolar transistor with a heterojunction emitter according to claim 7 wherein said ohmic contact disposed on a surface portion of the second layer is selected from the group of alloys consisting of Au-Ge and Au-Zn.

* * * * *